(12) United States Patent
Henker et al.

(10) Patent No.: US 10,951,208 B2
(45) Date of Patent: Mar. 16, 2021

(54) SLEW-LIMITED OUTPUT DRIVER CIRCUIT

(71) Applicant: RACYICS GMBH, Dresden (DE)

(72) Inventors: Stephan Henker, Nossen (DE);
Monika Dietrich, Dresden (DE)

(73) Assignee: RACYICS GMBH, Dresden (DE)

( * ) Notice: Subject to any disclaimer, the term of this patent is extended or adjusted under 35 U.S.C. 154(b) by 0 days.

(21) Appl. No.: 16/633,336

(22) PCT Filed: Aug. 3, 2018

(86) PCT No.: PCT/EP2018/071117
§ 371 (c)(1),
(2) Date: Jan. 23, 2020

(87) PCT Pub. No.: WO2019/025586
PCT Pub. Date: Feb. 7, 2019

(65) Prior Publication Data
US 2020/0162072 A1    May 21, 2020

(30) Foreign Application Priority Data

Aug. 4, 2017   (DE) .................... 10 2017 117 778.7

(51) Int. Cl.
*H03K 3/00*      (2006.01)
*H03K 17/16*     (2006.01)
(Continued)

(52) U.S. Cl.
CPC ....... *H03K 17/166* (2013.01); *H03K 19/0005* (2013.01); *H03K 19/01721* (2013.01)

(58) Field of Classification Search
CPC ........... H03K 17/166; H03K 19/01721; H03K 19/0005
(Continued)

(56) References Cited

U.S. PATENT DOCUMENTS

| 4,818,901 A | * | 4/1989 | Young | ............... H03K 19/0013 323/315 |
| 5,525,927 A | * | 6/1996 | Yung | ...................... G05F 3/262 323/315 |

(Continued)

FOREIGN PATENT DOCUMENTS

EP        0735687 A2    10/1996

OTHER PUBLICATIONS

International Report on Patentability issued in PCT/EP2018/071117 and dated Feb. 13, 2020.
(Continued)

*Primary Examiner* — Ryan Jager
(74) *Attorney, Agent, or Firm* — Heslin Rothenberg Farley and Mesiti PC; Nicholas Mesiti

(57) ABSTRACT

A slew-limited output driver circuit facilitates finding a circuitry that allows a flexible setting of the slew-rate of an integrated circuit, with only a small footprint and latency, and which allows realizing different driver modes without additional components integrated protection against ESD. A short circuit will be solved by a slew-limited output driver circuit comprising a switchable current mirror providing an output current equal to an input current, wherein the current mirror is controlled by an additional switch, which is switched in response to control signals and/or an output current level of the output driver circuit, wherein adjustable operating modes of the slew-limited output driver circuit are realized by the control signals.

14 Claims, 1 Drawing Sheet

(51) Int. Cl.
*H03K 19/00* (2006.01)
*H03K 19/017* (2006.01)

(58) Field of Classification Search
USPC .......................................................... 327/108
See application file for complete search history.

(56) References Cited

U.S. PATENT DOCUMENTS

| | | | |
|---|---|---|---|
| 5,581,197 A | 12/1996 | Motley et al. | |
| 5,654,663 A | 8/1997 | McClure et al. | |
| 5,654,981 A * | 8/1997 | Mahant-Shetti | H04L 25/0282 326/83 |
| 5,835,994 A * | 11/1998 | Adams | G05F 3/262 323/315 |
| 6,281,730 B1 * | 8/2001 | Vu | H03K 19/00384 323/316 |
| 6,441,653 B1 | 8/2002 | Spurlin | |
| 6,617,915 B2 * | 9/2003 | Rajan | G05F 3/262 323/315 |
| 7,205,826 B2 * | 4/2007 | Kim | H04W 52/028 327/538 |
| 7,471,111 B2 | 12/2008 | Seth et al. | |
| 7,859,505 B2 * | 12/2010 | An | G09G 3/3688 330/257 |
| 8,643,419 B2 * | 2/2014 | Rueger | H03F 3/2171 327/112 |
| 9,979,363 B2 * | 5/2018 | Ko | H03F 3/45273 |
| 2015/0103066 A1 * | 4/2015 | Tsuchi | G09G 3/3291 345/212 |
| 2017/0004799 A1 * | 1/2017 | Park | G09G 3/3688 |

OTHER PUBLICATIONS

International Search Report and Written Opinion issued in PCT/EP2018/071117 and dated Dec. 21, 2018.

* cited by examiner

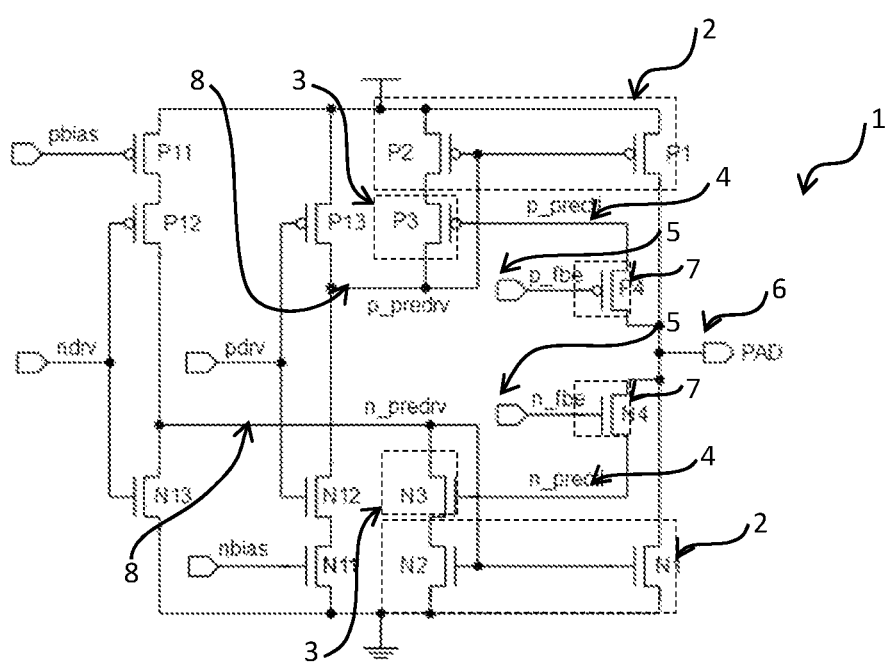

SLEW-LIMITED OUTPUT DRIVER CIRCUIT

CROSS REFERENCE TO RELATED APPLICATIONS

This application is the National Phase filing under 35 U.S.C. § 371 of International Application No. PCT/EP2018/071117, filed on Aug. 3, 2018, and published on Feb. 7, 2019 as WO 2019/025586 A1, which claims priority to German Application No. 102017117778.7, filed on Aug. 4, 2017. The contents of each of the prior applications are hereby incorporated by reference herein in their entirety.

The invention discloses a slew-limited output driver circuit.

BACKGROUND

With output drivers, fast rise times can cause electromagnetic emissions and noise. Furthermore, high output currents due to electro-migration reduce the life of said circuits. It is therefore desirable that an adequate limitation of the signal rise times would eliminate the disturbing effects. The signal rise times are related to the slew-rate which is defined as the change of voltage or current, or any other signal quantity, per unit of time.

In the prior art, various possibilities for limiting the rise time are known, which can be subdivided essentially into two groups: According to U.S. Pat. No. 6,441,653, namely the limitation of the output current and according to U.S. Pat. No. 7,471,111, namely the detection and adjustment of the voltage profile at the output pad of the driver.

The limitation of the output current possesses the following disadvantages: Resistors in the output path require high layout space for the resistive components, as a high current carrying capacity and thermal stability must be ensured. Furthermore, the signal level at the resistive load will be disturbed by the resulting resistive voltage divider between the driver and the current limiting. Also a dynamic change of the resistance value is difficult to manage.

If a current source as an output driver, as in U.S. Pat. No. 7,471,111, is used no low-impedance driver will be feasible and the signal level at the resistive load will be disturbed as well.

Also the detection and adjustment of the voltage curve at the output pad of the driver according to the prior art has a few disadvantages. On the one hand, if the output driver is regulated based on the output level, for example if, like in U.S. Pat. No. 6,441,653 the output current of the preamplifier is reduced in accordance with the output voltage, whereby the driver transistor is turned on slowly, it is detrimental that the recharge current of the preamplifier is partially dissipated. Furthermore, the output voltage shows a non-linear characteristic due to the variable gate voltage of the output driver, and an ESD (electrostatic discharge) protection for the transistor gate of the feedback will be necessary. On the other hand, if a reference edge is used and its replication has to be generated at the output of the output driver a high circuitry complexity is necessary, the switching speed is limited and there is a high latency in the signal path.

It is therefore the purpose of the invention to find a circuitry that allows a flexible setting of the slew-rate of an integrated circuit, with only a small footprint and latency, and which allows realizing different driver modes without additional components integrated protection against ESD and short circuit.

SUMMARY OF THE INVENTION

The object of the invention will be solved by a slew-limited output driver circuit comprising a switchable current mirror (P1, P2, respectively N1, N2) providing an output current equal to an input current, wherein the current mirror (P1, P2, respectively N1, N2) is controlled by means of an additional switch (P3, respectively N3), which is switched in response to control signals (prectl, fbe) and/or an output current level (PAD) of the output driver circuit, whereas adjustable operating modes of the slew-limited output driver circuit are realized by the control signals.

The core of the invention is the switchable current mirror (P1, P2 or N1, N2) which is switched by means of an additional switch (P3 or N3) in response to control signals (prectl, fbe) and/or the level at the output (PAD). The control signals prectl, fbe exist for the corresponding current mirror as p_prectl, p_fbe and n_prectl, n_fbe. The output node (PAD) provides an output current level according to the controlling and timing of the slew-limited output driver circuit.

The switchable current mirror (P1 and P2 with switch P3, N1 and N2 with switch N3 respectively) of the inventive slew-limited output driver circuit comprises a first current mirror (P1, P2) and a second current mirror (N1, N2), whereas each current mirror comprises a lead transistor (P2 or N2) and an output transistor (P1 or N1).

In a preferred embodiment of the inventive slew-limited output driver circuit, if the lead transistor (P2 or N2) of the first and/or second current mirror is switched as a diode, the output (PAD) functions as a current driver with high internal resistance. So, one or the other or both current mirrors (the first and the second current mirror) can be switched as a diode. If the lead transistor (P2 or N2) is switched as a diode, a constant gate voltage at the corresponding output transistor (P1 or N1) and thus a constant output current is generated, whereby a linear increase of the output voltage is achieved at a capacitive load. The output thus functions as a current driver with high internal resistance.

In another preferred embodiment of the inventive slew-limited output driver circuit, if the additional switch (P3 or N3) at the lead transistor (P2 or N2) of the first and/or second current mirror is open, the output (PAD) functions as a voltage source with low internal resistance. If the switch (P3 or N3) on the lead transistor (P2 or N2) is turned off, hence it is open, the gate-source voltage at the output transistor (P1 or N1) increases so that it opens completely and the output operates as a voltage source with low internal resistance.

In a further preferred embodiment of the inventive slew-limited output driver circuit, the control signals control a pull-up driver and a pull-down driver comprising pass transistors (P4, respectively N4) and the current mirror switch (P3, respectively N3). The pull-up driver is controlled by the control signals p_prectl, p_fbe and the pull-down driver is controlled by the control signals n_prectl, n_fbe.

It is preferred that the control signals are switched separately from each other. This has the effect that three different operation modes can be realized as described in the following.

In a preferred embodiment of the inventive slew-limited output driver circuit, if said control signals p_prectl and p_fbe are logic high (logic 1) and n_prectl and n_fbe are logic low (logic 0) the operating mode of the output driver is a voltage source mode, whereas a slew-rate of the slew-limited output driver circuit is not limited. Logic low or logic 0 means that the considered node is very low resistive or on ground level. Logic high or logic 1 means that the considered node is very low resistive or on supply voltage level. A tri-state means that the node is very high resistive. By adjusting the control signals in the described way above the operating mode of the slew-limited output driver circuit can be adjusted to a voltage source mode. In the voltage source mode the circuit has a low output impedance, a small rise/fall time and slew-rate is not limited.

In another preferred embodiment of the inventive slew-limited output driver circuit, if said control signals p_prectl and n_fbe are logic low (logic 0) and n_prectl and p_fbe are logic high (logic 1) the operating mode of the output driver is a current source mode, whereas the slew-rate of the slew-limited output driver is limited. In the current source mode the circuit has a high output impedance, constant output current, limited slew-rate and a linear change of output voltage on capacitive load.

In another preferred embodiment of the inventive slew-limited output driver circuit, if said control signals p_prectl and n_prectl are in a tri-state Z, p_fbe is logic low (logic 0) and n_fbe is logic high (logic 1) the operating mode of the output driver is automatically switched into a voltage source mode or into a current source mode as soon as a change in the output current level is performed. In the so-called automatic mode, the turn-off of the conducting transistor (P1 or N1) is controlled by the output voltage via a pass transistor (P4 or N4). If the output level has not yet reached the target voltage, the circuit operates as a current driver with limited output current and high internal resistance, however, if the target voltage level is reached, the circuit is automatically switched to voltage source mode with low internal resistance.

In a further preferred embodiment of the inventive slew-limited output driver circuit, if there is a short circuit at the output (PAD) of the output driver circuit, the output driver circuit remains in the current source mode and provides a limited output current only. Hence the inventive slew-limited output driver circuit provides an integrated short-circuit protection. If there is a short circuit at the output and the output level does not change, the driver remains in current source mode and provides only the limited set output current.

In a preferred embodiment of the inventive slew-limited output driver circuit, no transistor gates of the current mirror transistors and the additional switch are directly connected to the output (PAD). This has the advantage that since no transistor gates are connected directly to the output for the realization, there is no danger due to ESD events.

In a further preferred embodiment the slew-limited output driver circuit provides a switchable pre-emphasis by pre-charging/discharging the switchable current mirror. This means, that it is possible to pre-emphasize the output signal (pre-emphasis) by pre-charging or discharging the nodes p_predrv or n_predrv before the switching operation in order to improve the signal properties on lines with low-pass behavior. For this purpose, the current mirror is constructed as a high-swing cascode, which is switched at the cascode voltage. If the gate has been discharged before switching on, the output current starting from 0 will slowly increase to the set current limit (soft start); however, when the gate is charged, the output current rises rapidly to a value greater than the set current limit and then drops to the limit (this is called pre-emphasis).

The invention can be summarized by the following advantages over the prior art: Firstly, a constant output current during the switching phase of the output signal of the slew-limited output driver can be realized; secondly, the inventive circuit provides an integrated short-circuit protection; thirdly, there are different current limiting modes: a) switched off (voltage source mode), b) only active when changing level (automatic mode), c) permanently active (constant current source mode); fourthly, the inventive circuit provides a switchable pre-emphasis by pre-charging/discharging the current mirror; fifthly, only low chip area is necessary due to few additional elements; and sixthly, the feedback is inherently protected against ESD.

The invention will be explained in more detail using an exemplary embodiment.

BRIEF DESCRIPTION OF THE DRAWING FIGURES

The appended drawing shows

FIG. 1 Inventive slew-limited output driver circuit.

DETAILED DESCRIPTION

The FIGURE shows the inventive slew-limited output driver circuit. The inventive circuit uses in its core a current mirror (P1, P2 or N1, N2), by means of an additional switch (P3 or N3) in response to control signals (prectl, fbe) and/or the current level at the output (PAD) is switched. The control signals exist respectively for the pull-up driver (p_prectl, p_fbe) and the pull-down driver (n_prectl, n_fbe). They can be switched separately in a general embodiment.

If the lead transistor (P2 or N2) is switched as a diode, a constant gate voltage at the corresponding output transistor (P1 or N1) and thus a constant output current is generated, whereby a linear increase of the output voltage is achieved at a capacitive load. The output thus functions as a current driver with high internal resistance.

If the switch (P3 or N3) on the lead transistor (P2 or N2) is turned off, hence it is open, the gate-source voltage at the output transistor (P1 or N1) increases so that it opens completely and the output operates as a voltage source with low internal resistance.

By the control signals (prectl, fbe), the operating mode, for example the voltage source mode or the current source mode is set as shown in the following tables:

| p_prectl | p_fbe | function |
|---|---|---|
| logic 1 (low resistive, supply voltage) | logic 1 (low resistive, supply voltage) | voltage source mode slew-rate not limited |
| logic 0 (low resistive, ground) | logic 1 (low resistive, supply voltage) | current source mode slew-rate limited |
| Tri-state Z (high resistive) | logic 0 (low resistive, ground) | voltage source mode, current source mode/ slew-rate limitation will be automatically activated, if there is a level change at the output |
| else | | Not allowed |

| n_prectl | n_fbe | function |
|---|---|---|
| logic 0 (low resistive, ground) | logic 0 (low resistive, ground) | voltage source mode slew-rate not limited |
| logic 1 (low resistive, supply voltage) | logic 0 (low resistive, ground) | current source mode slew-rate limited |

| Tri-state Z (high resistive) | logic 1 (low resistive, supply voltage) | voltage source mode, current source mode/ slew-rate limitation will be automatically activated, if there is a level change at the output |
|---|---|---|
| | else | Not allowed |

In the so-called automatic mode, the turn-off of the conducting transistor (P1 or N1) is controlled by the output voltage via a pass transistor (P4 or N4). If the output level has not yet reached the target voltage, the circuit operates as a current driver with limited output current and high internal resistance, however, if the target voltage level is reached, the circuit is automatically switched to voltage source mode with low internal resistance.

If there is a short circuit at the output and the output level does not change, the driver remains in current source mode and provides only the limited set output current.

Since no transistor gates are connected directly to the output for the realization, there is no danger due to ESD events.

In addition, it is possible to pre-emphasize the output signal (pre-emphasis) by pre-charging or discharging the nodes p_predrv or n_predrv before the switching operation in order to improve the signal properties on lines with low-pass behavior. For this purpose, the current mirror is constructed as a high-swing cascode, which is switched at the cascode voltage. If the gate has been discharged before switching on, the output current starting from 0 will slowly increase to the set current limit (soft start); however, when the gate is charged, the output current rises rapidly to a value greater than the set current limit and then drops to the limit (this is called pre-emphasis).

The essential advantage of the claimed invention is the usage of a switchable current mirror, the control of the current mirror by direct feedback of the output, and the implementation of adjustable operating modes, such as current source mode/voltage source mode/automatically switchable mode.

LIST OF REFERENCE SIGNS

1 Slew-limited output driver circuit
2 switchable current mirror
P1+P2 first current mirror
N1+N2 second current mirror
P1, N1 output transistor
P2, N2 lead transistor
P3, N3 additional switch
P4 pull-up driver
N4 pull-down driver
x_prectl, x_fbe control signal, with x=p, n
PAD output with output signal

The invention claimed is:

1. Slew-limited output driver circuit comprising two switchable current mirrors providing an output current equal to an input current, wherein the current mirrors are controlled by additional switches, which are switched by a first set of control signals in response to a second set of control signals and to an output voltage level of the output of the output driver circuit, wherein different operating modes as a voltage source mode, a current source mode, or an automatic mode of the slew-limited output driver are realized by the control signals, wherein the second set of control signals are inputted to the output driver circuit at gate nodes of additional pass transistors connected also to the first set of control signals and the output, wherein the first set of control signals are input to the output driver circuit at source or drain nodes of said pass transistors.

2. The slew-limited output driver circuit according to claim 1, wherein when the lead transistor of the first and/or second current mirror is switched as a diode by means of a switch transistor that is controlled either by means of a pass transistor connecting to an output of the slew-limited output driver circuit or by directly controlling a control node of the switch transistor, the output functions as a current driver with high internal resistance.

3. The slew-limited output driver circuit according to claim 2, wherein no transistor gates of the current mirror transistors, the additional switch and the control circuitry thereof are directly connected to the output.

4. The slew-limited output driver circuit according to claim 3, wherein input signals to the current mirrors are connected as additional inputs of the slew-limited output driver circuit, providing a switchable pre-emphasis by optionally pre-charging or, respectively, discharging the control signals controlling the switchable current mirrors.

5. The Slew-limited output driver circuit according to claim 1, wherein when the additional switch at the lead transistor of the first and/or second current mirror is open, controlled to be open either by means of a pass transistor connecting to an output of the slew-limited output driver circuit or by directly controlling a control node of the switch transistor, the output functions as a voltage source with low internal resistance.

6. The slew-limited output driver circuit according to claim 1, wherein the first and second set of control signals control a pull-up driver comprising said current mirror and a said switch as well as a pull-down driver comprising a further current mirror and a further said switch by means of pass transistors and the said current mirror switches.

7. The slew-limited output driver circuit according to claim 6, wherein the control signals are inputted to the output driver circuit separately from each other.

8. The slew-limited output driver circuit according to claim 6, wherein no transistor gates of the current mirror transistors, the additional switch and the control circuitry thereof are directly connected to the output.

9. The slew-limited output driver circuit according to claim 8, wherein input signals to the current mirrors are connected as additional inputs of the slew-limited output driver circuit, providing a switchable pre-emphasis by optionally pre-charging or, respectively, discharging the control signals controlling the switchable current mirrors.

10. The slew-limited output driver circuit according to claim 1, wherein when said control signals p_prectl and p_fbe are high and n_prectl and n_fbe are low the operating mode of the output driver is a voltage source mode, wherein a slew-rate of the slew-limited driver is not limited.

11. The slew-limited output driver circuit according to claim 1, wherein when said control signals p_prectl and n_fbe are low and n_prectl and p_fbe are high the operating mode of the output driver is a current source mode, wherein the slew-rate of the slew-limited driver is limited.

12. The slew-limited output driver circuit according to claim 1, wherein when said control signals p_prectl and n_prectl are in a tri-state Z, p_fbe is low and n_fbe is high the operating mode of the output driver is automatically switched into a voltage source mode or into a current source mode if a change in the output current level is performed.

13. The slew-limited output driver circuit according to claim 1, wherein no transistor gates of the current mirror transistors, the additional switch and the control circuitry thereof are directly connected to the output.

14. The slew-limited output driver circuit according to claim 1, wherein input signals to the current mirrors are connected as additional inputs of the slew-limited output driver circuit, providing a switchable pre-emphasis by optionally pre-charging or, respectively, discharging the control signals controlling the switchable current mirrors.

* * * * *